United States Patent [19]
Schmits et al.

[11] Patent Number: 5,791,453
[45] Date of Patent: Aug. 11, 1998

[54] TRANSPORTING DEVICE WITH FIXATION FINGER

[75] Inventors: Jeroen Lambertus Schmits, Houten; Eric Albertus Maria Wullems, Etten-Leur, both of Netherlands

[73] Assignee: Soltec B.V., Oosterhout, Netherlands

[21] Appl. No.: 681,472

[22] Filed: Jul. 23, 1996

[30] Foreign Application Priority Data

Aug. 29, 1995 [NL] Netherlands .................. 1001090

[51] Int. Cl.$^6$ ........................................ B65G 15/12
[52] U.S. Cl. ........................ 198/626.6; 198/803.7; 198/817
[58] Field of Search ........................... 198/626.6, 803.7, 198/817

[56] References Cited

U.S. PATENT DOCUMENTS

| | | | |
|---|---|---|---|
| 4,180,156 | 12/1979 | Popov et al. | 198/626.6 |
| 4,780,040 | 10/1988 | Petersen | 198/817 |
| 4,840,268 | 6/1989 | Zemek | 198/817 |

FOREIGN PATENT DOCUMENTS

| | | |
|---|---|---|
| 0 224 440 | 6/1987 | European Pat. Off. |
| 0 317 213 | 5/1989 | European Pat. Off. |
| 0 393 796 | 10/1990 | European Pat. Off. |

OTHER PUBLICATIONS

B.H. Sharp, "Carrier Assemblies for Wave Solder Machine Palletless Conveyor," Western Electric; pp. 31–32, Nov. 1974.

Primary Examiner—Joseph E. Valenza
Assistant Examiner—Mark Deuble
Attorney, Agent, or Firm—Banner & Witcoff Ltd.

[57] ABSTRACT

The invention relates to a transporting device for flat objects, for instance printed circuit boards, comprising two endless carriers which are guided by two parallel extending guides, wherein the carriers are each provided with supports extending substantially horizontally in the direction toward the other carrier, wherein at least a part of the total number of supports is provided with at least one clamp fixing in substantially vertical direction flat objects resting on the supports. Preferably, the clamp is adapted to also exert a horizontal force on flat objects resting on the supports. This results in the flat objects also being fixed in the horizontal direction so that they cannot become detached in this direction either.

17 Claims, 4 Drawing Sheets

TRANSPORTING DEVICE WITH FIXATION FINGER

BACKGROUND OF THE INVENTION

The invention relates to a transporting device for flat objects, for instance printed circuit boards, comprising two endless carriers which are guided by two parallel extending guides, wherein the carriers are each provided with supports extending substantially horizontally in the direction toward the other carrier.

Such transporting devices are generally known in the relevant field.

Particularly during processing of such flat objects with temperature treatments during transport there is the danger of the flat objects warping as a consequence of these temperature treatments. This causes problems during transport since the probability of the warped flat objects falling off the supports becomes considerable, which of course will cause acute disruption of the treatment process.

There is the further possibility of the substantially flat objects remaining warped, also after ending of the treatment, so that they are then less suitable for their eventual application.

Such a problem occurs particularly, though not exclusively, in soldering machines during the treatment of printed circuit boards. This includes not only reflow-solder machines but also wave-solder machines. In both cases the printed circuit boards are subjected to a temperature treatment whereby they can warp. There is also the danger here of the printed circuit boards possibly falling off the transporting device, while there is the additional danger that after ending of the soldering process the printed circuit boards remain warped and cannot be fitted properly.

Printed circuit boards must for instance be envisaged here which have to be fitted into small devices, for instance portable telephones, or larger printed circuit boards which have to be placed into racks of for instance computers.

SUMMARY OF THE INVENTION

The object of the present invention is to obviate the above stated problems.

This object is achieved in that at least a part of the total number of supports is provided with at least one clamp fixing in vertical direction flat objects resting on the supports.

Through the action of this clamp the edges of the flat objects for treatment are subjected to a vertically directed force so that they remain pressed onto the supports, thus preventing warping.

According to a preferred embodiment the clamp is adapted to also exert a horizontal force on flat objects resting on the supports. This results in the flat objects also being fixed in the horizontal direction so that they cannot become detached in this direction either. It is pointed out here that as a result of the temperature treatment or a possible other chemical treatment changes in the volume of the flat objects can occur which can be assimilated by the clamp.

BRIEF DESCRIPTION OF THE DRAWINGS

The invention will be elucidated hereinbelow with reference to the annexed drawing, in which.

DETAILED DESCRIPTION OF THE INVENTION

Figure 1:
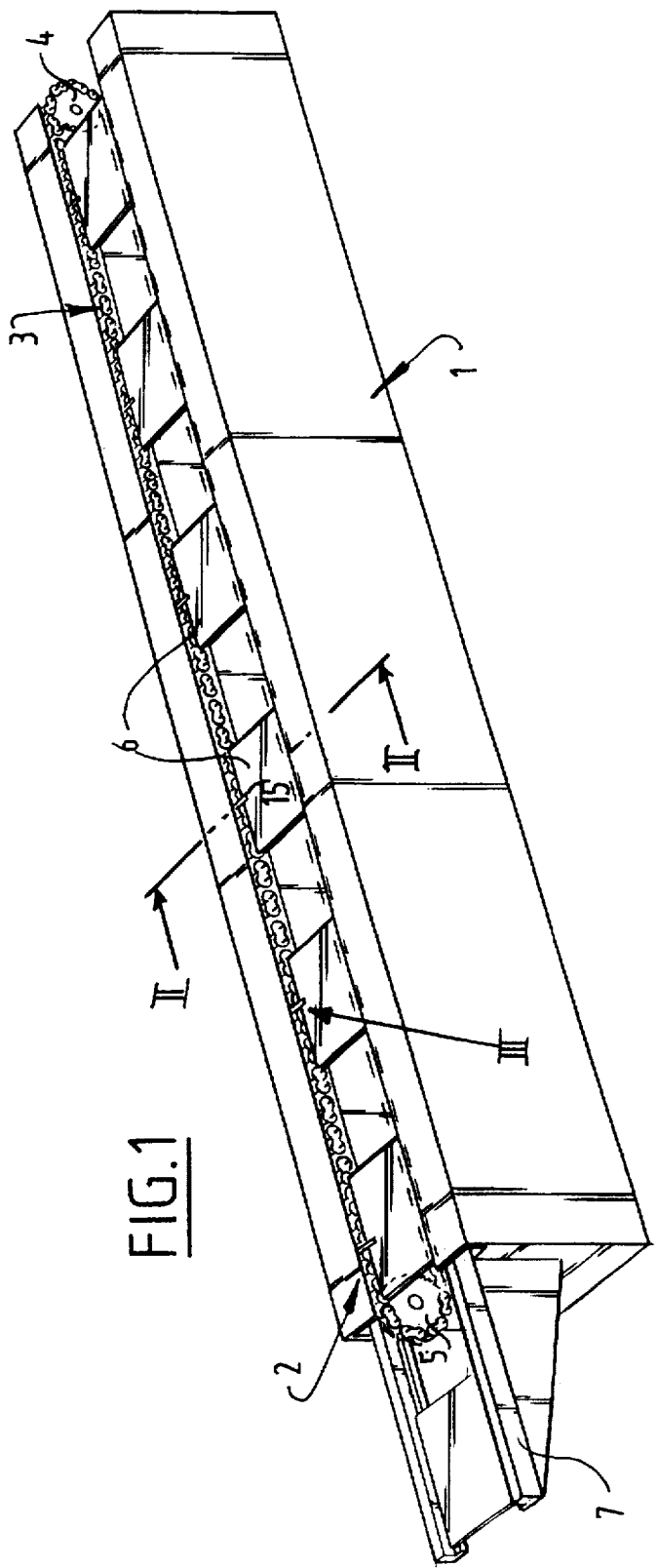
FIG. 1 shows a schematic perspective view of a soldering machine on which is arranged a transporting device according to the present invention.

Shown in FIG. 1 is a soldering machine 1 on the top side of which is arranged a transporting device 2 according to the invention. This transporting device 2 is formed by two chain tracks 3, only one of which can be seen, which are guided round chain wheels 4, 5 arranged respectively at the beginning and end of the soldering machine. The chain track is of course also further guided by other guide elements not shown in the drawing. The transporting device 2 is adapted to transport printed circuit boards 6 to be subjected to a soldering treatment. These printed circuit boards 6 are supplied from a feed transporting device 7 which is not a subject of the invention and which is thus not shown in detail. Such transporting devices are generally known in the relevant field of the art.

Figure 2:
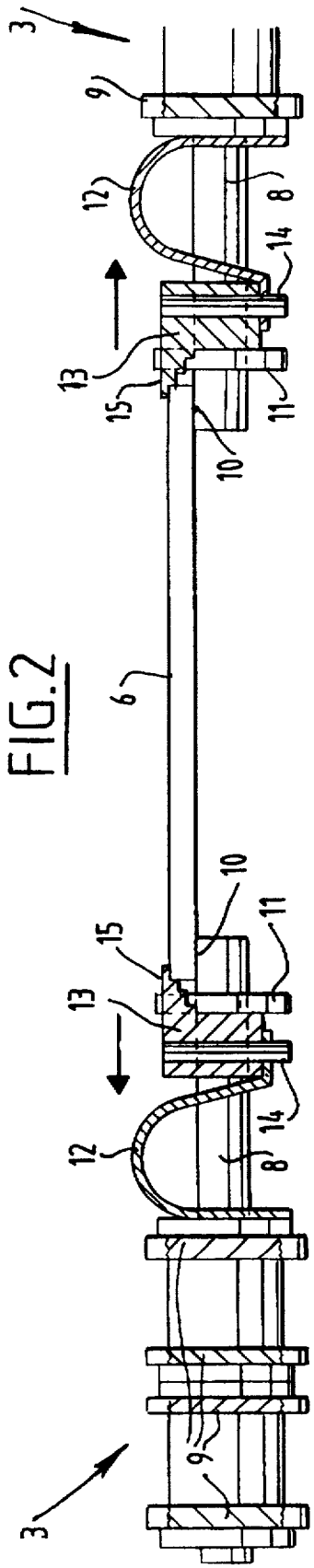
FIG. 2 shows a sectional view along the line II—II in FIG. 1.

The construction according to the present invention is further elucidated with reference to FIG. 2. FIG. 2 shows in cross section both chains 3, which are formed by chain pins 8 mutually connected by chain links 9. Chain pins 8 are elongated toward the side of the other chain so that a supporting surface 10 is created on which the flat objects for transporting, in this case the printed circuit boards 6, can rest. Rings or links 11 are arranged on chain pins 8 to fix the printed circuit boards 6 in horizontal direction.

Figure 3:
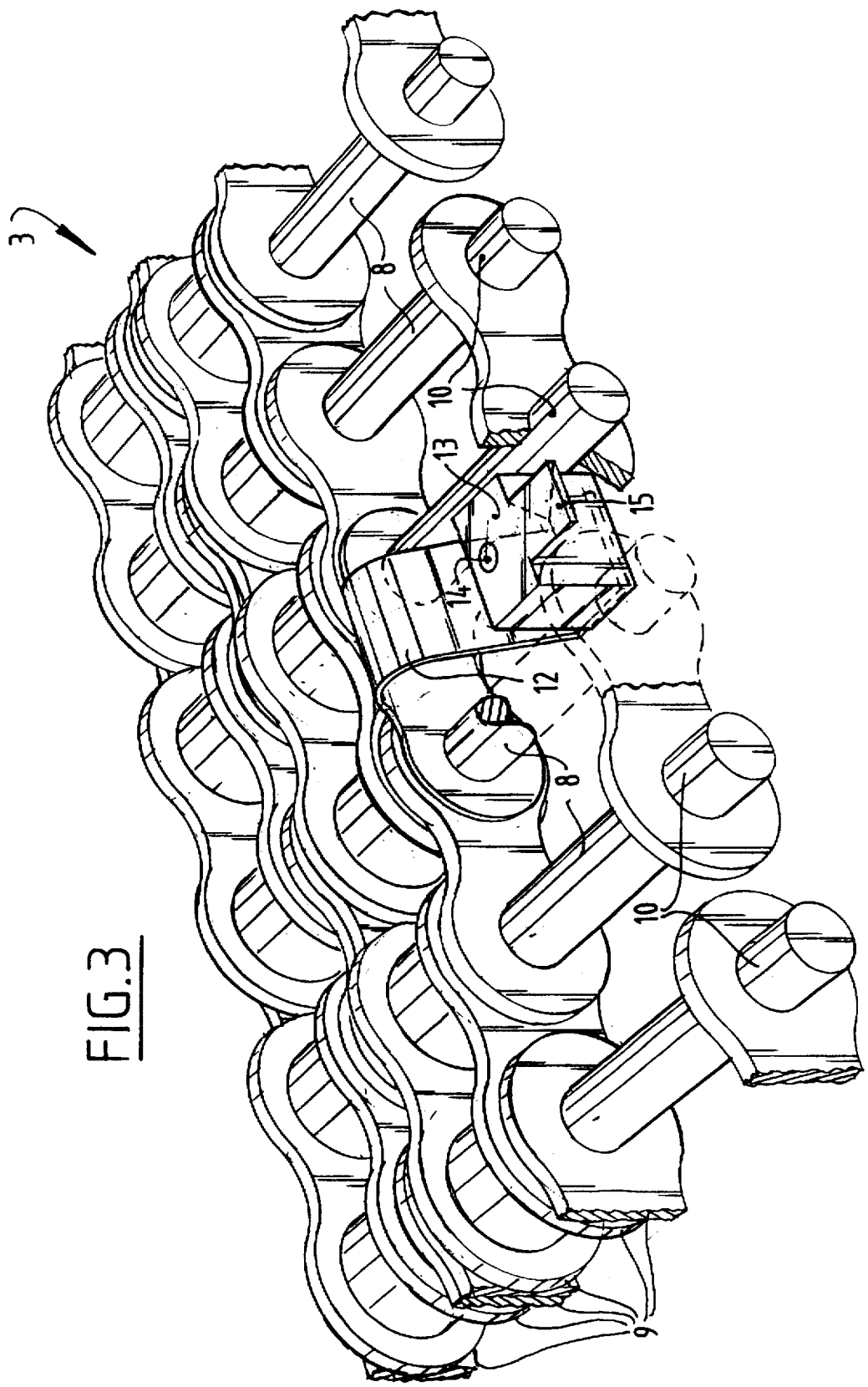
FIG. 3 shows a perspective detail view of the transporting device depicted in FIG. 1.

According to the embodiment shown in FIGS. 2 and 3 the clamp according to the invention is formed inter alia by a leaf spring 12 which is fixed in the manner of a link to two adjacent pins 8 and which is bent substantially in a reversed U. A block 13 is arranged on the free end of leaf spring 12, which block 13 is fixed to the free end of spring 12 by means of a pin 14.

The action of the spring is such that block 13 undergoes a force directed downward and toward the side of the chain located opposite. The block 13 is provided with a nose 15 on the side of the printed circuit board 6 for transporting. The underside of nose 15 is provided with a stepped surface as shown in FIG. 2. The printed circuit board 6 is fixed using the nose 15.

Figure 4:
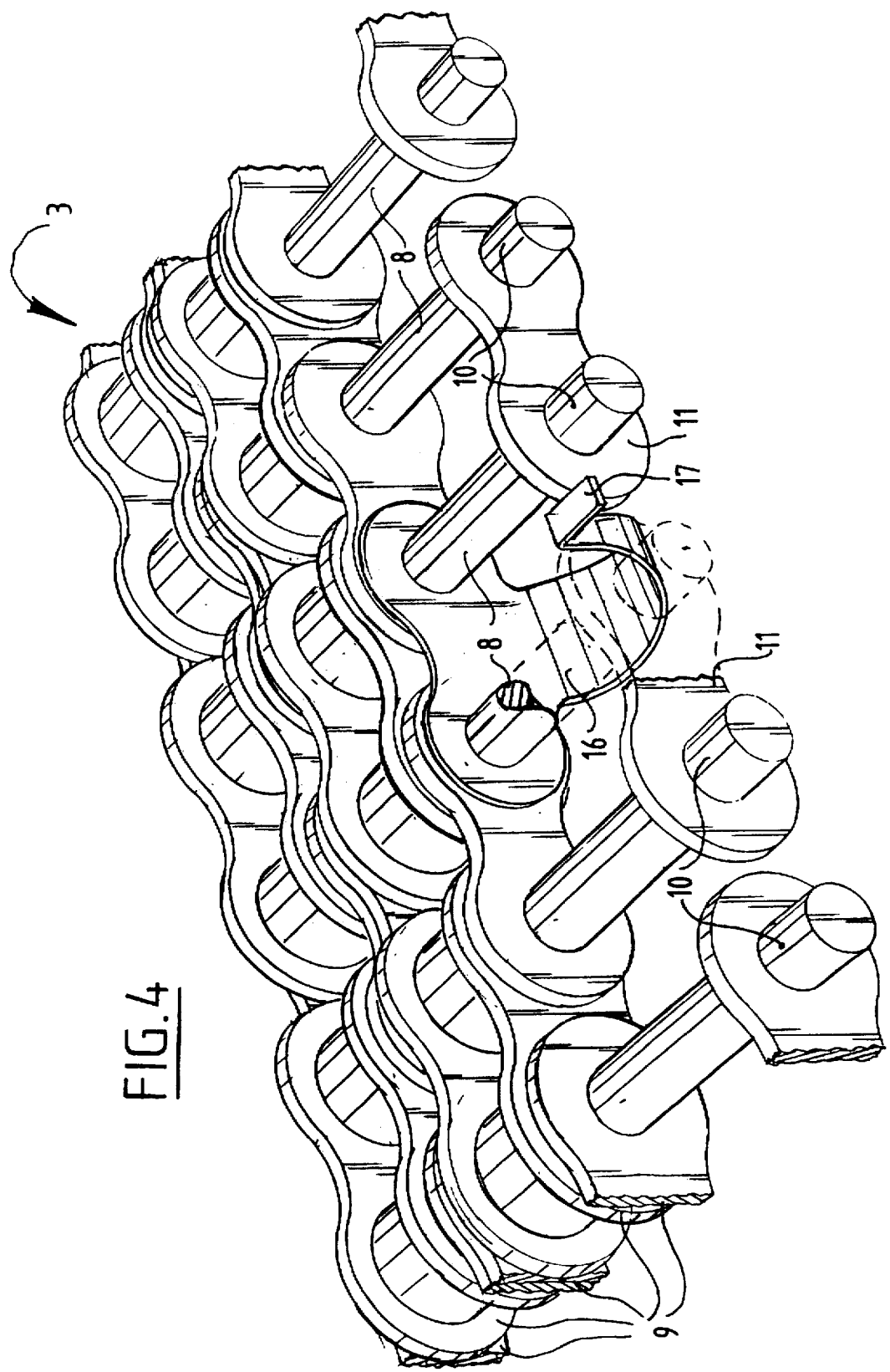
FIG. 4 is a perspective detail view of a variant of the transporting device according to the invention.

According to another embodiment as shown in FIG. 4 the block 13 is omitted. Used instead is a differently bent spring 16 which is provided on its free end with a fixation lip 17.

Figure 5:
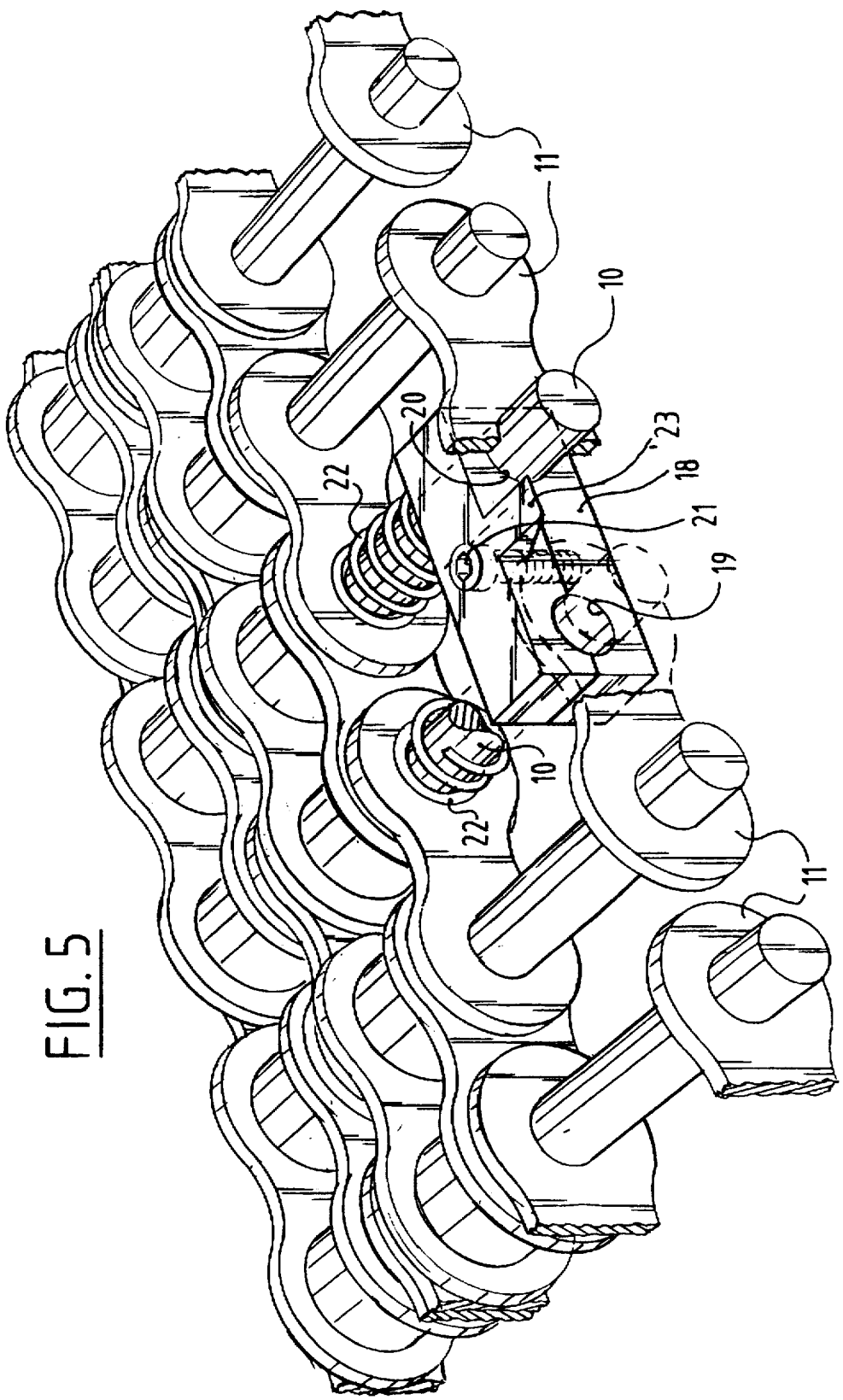
FIG. 5 is a perspective view of another variant of the transporting device according to the invention.

The embodiment shown in FIG. 5 shows some similarity to the embodiment shown in FIG. 3. The embodiment of FIG. 5 likewise comprises a block 18 which is provided with two holes 19, 20. A pin 10 extends through each of the holes 19, 20. The block 18 can thus slide in transverse direction over two pins. Block 18 is itself formed by two halves which are as identical as possible and which are mutually joined by means of a screw 21. This facilitates fitting.

It will be apparent that the movement of block 18 is limited by the links 11. Coil springs 22 are arranged round each of the relevant pins 10 in order to press the block outward.

The upper half of block 18 is further provided with a nose 23 which is chamfered on the underside. The nose has a form such that it protrudes to a sufficient extent through two adjoining links 11 to lock flat objects resting on the outer ends of pins 10 against movement in upward direction.

It will be apparent that instead of the shown construction other constructions can be applied, for instance with other types of spring. These are preferably then disposed obliquely in order according to the preferred embodiment to be able to generate both a horizontally and a vertically directed fixation force.

It is possible instead also to use separate springs for the horizontal and vertical forces.

We claim:

1. Transporting device for flat objects, for instance printed circuit boards, comprising two endless carriers which are guided by two parallel extending guides, wherein the carriers are each provided with supports extending substantially horizontally in the direction toward the other carrier, wherein at least a part of the total number of supports is provided with at least one clamp for fixing in substantially vertical direction flat objects resting on the supports, and wherein the carriers are formed by an endless chain, at least some of the pins of which are elongated in the direction toward the other chain and the thus formed elongations form the supports, and the clamp comprises a spring fixed to the chain, characterized in that the spring is a leaf spring which is fixed to the chain and which has a substantially U shaped cross section.

2. Transporting device as claimed in claim 1, characterized in that the clamp is adapted to exert a substantially vertically directed force on the objects resting on the supports.

3. Transporting device as claimed in claim 1, characterized in that the clamp is adapted to also exert a substantially horizontal force on the flat objects resting on the supports.

4. Transporting chain as claimed in claim 1 characterized in that said leaf spring is fixed to the chain in the manner of a link.

5. Transporting device as claimed in claim 3, characterized in that the clamp comprises a block which is guided in at least horizontal direction between two adjoining pins and which is connected to the spring.

6. Transporting device as claimed in claim 3, characterized in that the clamp comprises a block which is provided with two holes, wherein a pin extends through each of the holes.

7. Transporting device as claimed in claim 5, characterized in that the block is provided with a nose for fixedly clamping the flat objects.

8. Transporting device as claimed in claim 7, characterized in that the nose is step-like.

9. Transporting device as claimed in claim 3, characterized in that the spring is provided on its free end with a fixation lip.

10. Transporting device as claimed in claim 2, characterized in that the clamp is adapted to also exert a substantially horizontal force on the flat objects resting on the supports.

11. Transporting device as claimed in claim 1, characterized in that the clamp comprises a block which is guided in at least horizontal direction between two adjoining pins and which is connected to the spring.

12. Transporting device as claimed in claim 1, characterized in that the clamp comprises a block which is provided with two holes, wherein a pin extends through each of the holes.

13. Transporting device as claimed in claim 6, characterized in that the block is provided with a nose for fixedly clamping the flat objects.

14. Transporting device as claimed in claim 1, characterized in that the spring is provided on its free end with a fixation lip.

15. Transporting device for flat objects, for instance printed circuit boards, comprising two endless carriers which are guided by two parallel extending guides, wherein the carriers are each provided with supports extending substantially horizontally in the direction toward the other carrier, wherein at least a part of the total number of supports is provided with at least one clamp for fixing in substantially vertical direction flat objects resting on the supports, and wherein the carriers are formed by an endless chain, at least some of the pins of which are elongated in the direction toward the other chain and the thus formed elongations form the supports, and the clamp comprises a spring fixed to the chain, characterized in that the clamp comprises a block which is provided with two holes, wherein a pin extends through each of the holes.

16. Transporting device as claimed in claim 15, characterized in that the block is provided with a nose for fixedly clamping the flat objects.

17. Transporting device as claimed in claim 16, characterized in that the nose is chamfered.

* * * * *